United States Patent
Chang et al.

(10) Patent No.: US 6,395,576 B1
(45) Date of Patent: May 28, 2002

(54) HIGH EFFICIENCY COLOR FILTER PROCESS TO IMPROVE COLOR BALANCE IN SEMICONDUCTOR ARRAY IMAGING DEVICES

(75) Inventors: Chih-Kung Chang, Hsin-Chu; Yu-Kung Hsiao, Tao-Yuan; Sheng-Liang Pan; Bii-Junq Chang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/593,537

(22) Filed: Jun. 14, 2000

(51) Int. Cl.[7] ............................................. H01L 21/00
(52) U.S. Cl. .......................................... 438/70; 438/65
(58) Field of Search ............................. 438/60, 65, 68, 438/69, 70, 71, 72, 75, 144

(56) References Cited

U.S. PATENT DOCUMENTS

| | | | |
|---|---|---|---|
| 5,143,855 A | 9/1992 | Pace et al. ...................... | 437/3 |
| 5,358,810 A | 10/1994 | Yoshino ....................... | 430/20 |
| 5,677,202 A | 10/1997 | Hawkins et al. ................ | 437/3 |
| 5,725,975 A | 3/1998 | Nakamura et al. ............. | 430/5 |
| 5,770,349 A | 6/1998 | Suginoya et al. ........... | 430/321 |
| 5,877,040 A | 3/1999 | Park et al. ...................... | 438/70 |
| 6,033,813 A | * 3/2000 | Endo et al. ..................... | 430/7 |
| 6,171,883 B1 | * 1/2001 | Fan et al. ..................... | 438/65 |
| 6,171,885 B1 | * 1/2001 | Fan et al. ..................... | 438/70 |

* cited by examiner

Primary Examiner—David Nelms
Assistant Examiner—Phuc T. Dang
(74) Attorney, Agent, or Firm—George O. Saile; Stephen B. Ackerman; Stephen G. Stanton (57) ABSTRACT

Formation of integrated color filters for gain-ratio balanced semiconductor array imagers using a spectrophotometric feedback control loop to adjust layer thickness during the deposition process is disclosed. The fabrication sequence of G/R/B conventionally used in Prior Art has been changed to B/R/G or B/G/R to enable the process to adapt to yielding specified color gain-ratio values without the need for integrated circuit redesign. A high efficiency color filter process is demonstrated wherein the additional neutral-density attenuator layers and/or spacer layers required in Prior Art fabrication methods are eliminated. The disclosed process is shown to enable high-precision thickness control of the color filter layers. Blue coating lift-off problems and the steric effect associated with successive depositions of color layers having step-height variations are eliminated. Statistical process control (SPC) is optimized by calibration of the color balance gain-ratio using the product photodiode arrays and amplifier integrated circuits with a real-time spectrophotometric feedback control-loop during the dye or pigment layer deposition process.

16 Claims, 6 Drawing Sheets

HIGH EFFICIENCY COLOR FILTER PROCESS TO IMPROVE COLOR BALANCE IN SEMICONDUCTOR ARRAY IMAGING DEVICES

BACKGROUND OF THE INVENTION (1) Field of the Invention

The present invention relates to a highly efficient and adaptive microelectronic fabrication process for adjusting color filter formation to optimize pixel color sensitivity balance and to control the red:green:blue gain-ratio in optoelectronic semiconductor array imaging devices.

(2) Description of Prior Art

Synthetic reconstruction of color images in solid-state analog or digital video cameras is conventionally performed through a combination of an array of optical microlens and spectral filter structures and integrated circuit amplifier automatic gain control operations following a prescribed sequence of calibrations in an algorithm.

Typically solid-state color cameras are comprised of charge-coupled device (CCD), Charge-Injection Device (CID), or Complementary Metal-Oxide Semiconductor (CMOS) structures with planar arrays of microlenses and primary color filters mutually aligned to an area array of photodiodes patterned onto a semiconductor substrate. The principal challenge in the design of solid-state color camera devices is the trade-off between adding complexity and steps to the microelectronic fabrication process wherein color filters are integrally formed in the semiconductor cross-sectional structure versus adding complexity and integrated electronic circuitry for conversion of the optical analog signals into digital form and signal processing with color-specific automated gain-control amplifiers requiring gain-ratio balance. The trade-off between microelectronic fabrication process complexity versus electronic complexity is determined by a plurality of factors, including product manufacturing cost and optoelectronic performance.

The problem in semiconductor array devices for color imaging fundamentally arises because different color pixels in the matrix exhibit varying spectral sensitivity to the different wavelengths or frequencies contained in the incident image light. For example, a photodiode element or sensor in the matrix array that is more sensitive to red light than blue light creates an imbalance in the captured image.

The imbalance can be corrected either by precompensation in the color-filter array, achieved by designing the fabrication process adaptively, or, digitally after the analog-to-digital conversion (ADC) step. It is well known, however, that post-processing signals after ADC is too late to avoid adding undesired quantization noise. Electrical signal precompensation to correct the color sensitivity imbalance, analogous to the aforementioned alternative color-filter process approach, is possible, and, is performed before ADC by adding to each color-pixel output signal a signal quantity derived from a color-specific gain controlled amplifier and additional circuitry for the control of the red:green:blue gain-ratio.

Typical CMOS image sensors incorporate more functional integration than do CCD sensors, which are manufactured by a specialized process, thereby making it a challenge to add image-processing circuitry to the chips. In contrast, CMOS sensors are made with the same high-volume processes used to build most computer chips, so digital circuitry can be added to enhance sensor functionality. The CMOS sensor chips typically integrate pixel array, timing logic, sampling circuits, amplifiers, reference voltage supplies, and ADC's. The CCD sensor chips require a minimum of two support chips to accomplish the same functions as CMOS. The increased integration offered by CMOS sensors can reduce system complexity and allow smaller camera designs. But, more circuits on CMOS chips increase the potential for noise from one section of the chip to interfere with the operations of another section.

A frequent problem is the noise generated by the digital section can interfere with the highly sensitive front-end analog circuits and degrade image quality. In either case of CCD or CMOS devices, it is clearly seen that the preferred method for improving color balance in semiconductor array imaging devices is the analog optical filter, with attendant simplicity of circuitry and avoidance of the electrical noise interference introduced by added circuitry needed to execute color-compensation functions.

Color-photosensitive integrated circuits require carefully configured color filters to be deposited on the upper layers of a semiconductor device in order to accurately translate a visual image into its color components. Conventional configurations may generate a color pixel by employing four adjacent pixels on an image sensor. Each of the four pixels is covered by a different color filter selected from the group of red, blue and two green pixels, thereby exposing each monochromatic pixel to only one of the three basic colors. Simple algorithms are subsequently applied to merge the inputs from the three monochromatic pixels to form one full color pixel. The color filter deposition process and its relationship to the microlens array formation process determine the production cycle-time, test-time, yield, and ultimate manufacturing cost. It is an object of the present invention to teach color-filter processes which optimize these stated factors.

In addition to the dynamic range and noise of the individual photodetectors, the resolution or fidelity of a CCD or CMOS image is influenced by the overall array size, individual pixel size, spacing, and fill factor. Quantitatively, this performance is described by a wavelength-dependent modulation transfer function (MTF) that relates the two-dimensional Fourier transform of the input image to that of the output. In addition to the obvious effects of pixel aperture and shape, the MTF of an array is affected by spatial carrier diffusion, temporal diffusion, and optical diffraction.

While color image formation may be accomplished by recording appropriately filtered images using three separate arrays, such systems tend to be large and costly. Cameras in which a full color image is generated by a single detector array offer significant improvements in size and cost but have inferior spatial resolution. Single-chip color arrays typically use color filters that are aligned with individual columns of photodetector elements to generate a color video signal. In a typical stripe configuration, green filters are used on every other column with the intermediate columns alternatively selected for red or blue recording. To generate a color video signal using an array of this type, intensity information from the green columns is interpolated to produce green data at the red and blue locations. This information is then used to calculate a red-minus-green signal from red-filtered columns and a blue-minus-green signal from the blue ones.

Complete red-minus-green and blue-minus-green images are subsequently interpolated from this data yielding three complete images. Commercial camcorders use a process similar to this to generate a color image but typically utilize more complicated mosaic-filter designs. The use of alternate columns to yield color information decreases the spatial resolution in the final image.

Figure 1:
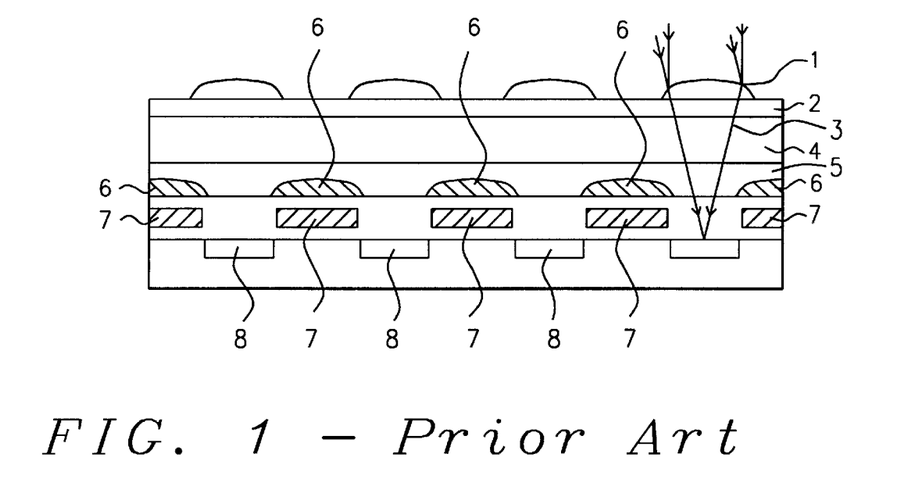
FIG. 1 is a simplified schematic cross-sectional profile of semiconductor and optical structures showing a typical order of elements of a conventional Prior Art device for color image formation.

FIG. 1 exhibits the conventional Prior Art vertical semiconductor cross-sectional profile and optical configuration for color image formation. Microlens 1 residing on a planarization layer 2 which serves as a spacer collects a bundle of light rays from the image presented to the video camera and converges the light into focal cone 3 onto photodiode 8 after passing through color filter(s) 4 residing on planarization layer 5, passivation layer 6, and metallization layer 7.

Figure 2:
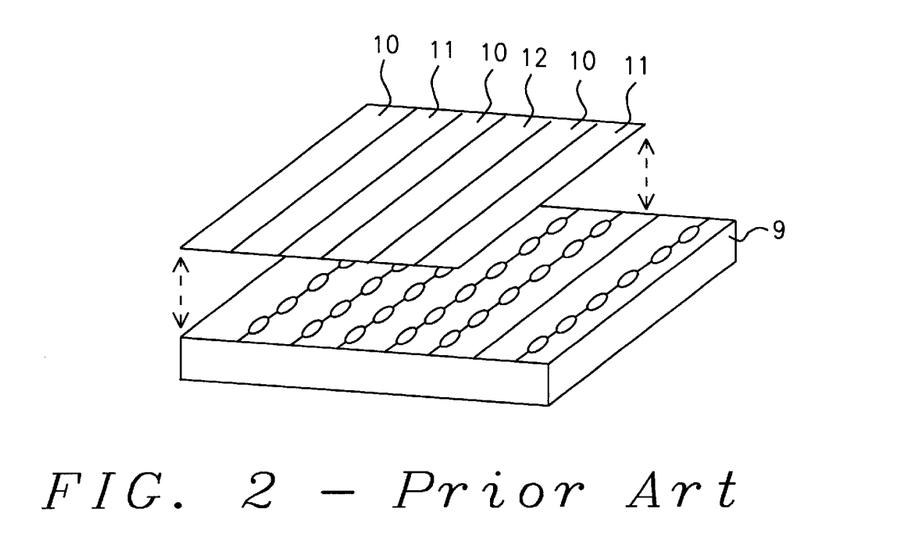
FIG. 2 exhibits the order of stripe color filters in an aligned overlay to rows or columns of photodetector elements of the semiconductor color imaging array of Prior Art.

FIG. 2 illustrates a representative Prior Art example for the generation of a color image by a single photodetector array 9 by using a color filter mask comprised of green stripe 10, red stripe 11, green stripe 10, blue stripe 12, green stripe 10, and red stripe 11. In this scheme, green filters are placed over alternate photodetector columns. Red and blue filters alternate in the spaces between them. Interpolation routines are used to generate three-color data for all pixel positions.

Figure 3:
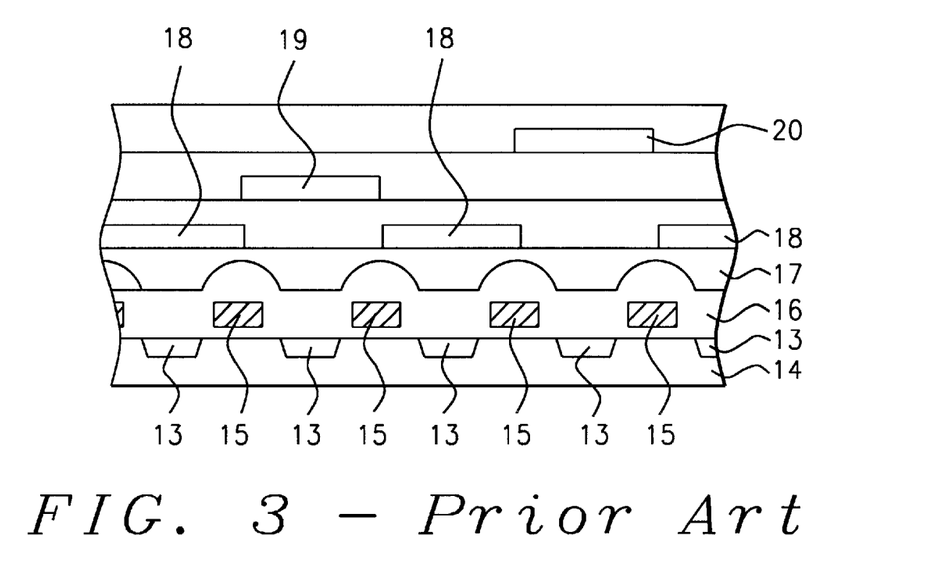
FIG. 3 illustrates the vertical profile and configuration of the green, red, blue color pixel sequence of Prior Art.

FIG. 3 provides a schematic cross-sectional view for a three-dimensional version of the scheme shown in FIG. 2. In both FIG. 2 and FIG. 3, the microlens arrays are intentionally left out to simplify the discussion of the filter fabrication sequence and configuration for color pixel synthetic reconstruction. In FIG. 3, photoactive regions 13 on semiconductor substrate 14, are successively overlayed with a patterned conductor layer 15, blanket passivation layer 16, blanket planarizing layer 17, first color filter layer 18 for green, second color filter layer 19 for red, and third color filter layer 20 for blue. Reading from left to right in FIG. 3, one observes the order of green, red, green, blue, and, periodic repetitions of this sequence.

Park et al in U.S. Pat. No. 5,877,040 shows a CCD with a convex microlens formed integrally on the planarization layer above a photodiode element of a CCD array such that the focal-distance of the lens may be positioned by adjustment of the intervening film-layer thicknesses. Following a dry-etch step of the substrate, the set of convex microlenses are formed in a second planarization layer above a first planarization layer containing color filters. No specification of the physical or spectrophotometric properties of the color filters, nor any specification of particular sequences for multiple color filter layers is provided.

Pace et al in U.S. Pat. No. 5,143,855 describe a color filter process in which the primary objects of the invention are the fabrication method for microregistration of dyeable polymer layers aligned with the photosensing elements and the provision for making contact openings for a bonding pad pattern in an inorganic passivation layer on which the color filters are formed. Here again, no specification of the order of the color filter sequence nor spectrophotometric properties are provided.

Hawkins et al in U.S. Pat. No. 5,677,202 teach a color filter process in which the principal object of the invention is the achievement of all color filter elements of the array to have entirely coplanar top and bottom surfaces with no overlap and with minimal gaps or no gaps between adjacent filter elements. In common with Prior Art, no specification of the spectrophotometric properties of the color filters nor the order of the sequence of the colors is provided.

In U.S. Pat. No. 5,358,810, Yoshino et al describe a low-cost, mass manufacturing color filter process for forming a stripe color filter in various resin-based materials for a liquid crystal display device in an electrode substrate. The liquid crystal application is significantly different from the solid-state color image camera, including illumination sources and conditions, no need for microlens and related alignments, no semiconductor photosensors and required mutual alignments to microlens and filter sequences, and, no need to balance the red:green:blue gain-ratios required for pixel creation algorithms.

Suginoya et al in U.S. Pat. No. 5,770,449 teach forming color filters for a multicolor liquid crystal display by electrodeposition and by patterning using color filters as masks. Applicable to forming and patterning a plurality of electrodes for liquid crystal displays, this method would not be practical for the precision of photolithographic alignments of microlenses and color filters in semi-conductor matrix array color imaging devices.

The fabrication process for formation of a stepped transmittance gradation mask for providing neutral-density attenuators for color filters used in liquid crystal display devices is described in U.S. Pat. No. 5,725,975 by Nakamura et al. Photolithographically patterned semi-transparent films, illustrated with chromium compounds, are interposed with color filters to adjust transmittances to predetermined values for each of the plurality of prescribed areas of the color filter gradation mask. Transmittance values for the color filters comprising the gradation mask are adjusted by calculated thickness variations of the semitransparent metal film areas.

SUMMARY OF THE INVENTION

The color filter processes and structures taught in the present invention can be clearly distinguished from the Prior Art and will be shown to include fewer process steps and improved accuracy and precision. A principal object of the present invention is to teach a particular sequential order for the formation and vertical profile of the color filters integrated into semiconductor array imaging cameras and related devices.

In accord with a principal object of the present invention, there is provided by the present invention a manufacturing method and microelectronic fabrication process sequence which minimizes the number and task-times of the operational steps required in the production of semiconductor arrays for color imaging devices. In current conventional color filter processes for CCD/CMOS image sensor devices, the most ordinary coating sequence is in the order of green (G) followed by red (R) followed by blue (B), designated G/R/B. However, the relative thicknesses of G/R/B directly effects the color gain-ratio. The spectral absorption of each of the G/R/B filters to specific wavelengths of light commonly employed in photoresist exposure, such as the I-line, are each different. If the thickness of the blue coating is to too high, the absorption to the I-line will be excessive and result in color pixel sensitivity imbalance. Since the integrated circuits (IC) responsible for pixel color gain are relatively fixed in dynamic range by design, the present invention solves the problems of avoiding complicated circuit redesign, time-consuming and expensive photolithographic mask-making and/or deposition system retooling by providing a real-time spectrophotometric and algorithmic feedback process control method suitable for the color pixel thickness adjustments in a specified coating technique and particular layer-order to result in a wider, robust process window. By changing the color coating sequence to blue first, followed by red, followed by green, designated B/R/G, a first layer with high transmittance, defined as greater than or equal to 80%, widens the process window. Similarly, the coating arrangement B/G/R provides the color pixel structure (G,B) or (G,R) with wider process window, reduced blue layer thickness than green first, and, stronger adhesion to the substrate to avoid pixel lift-off.

A principal object of the present invention is, therefore, to disclose the method and means to regulate the relative thickness of each color filter layer to obtain the desired gain balance without changes to any circuit layout.

It is another object of the present invention to directly vary the dye or pigment concentration loading of each color filter based on spectrophotometric measurement data to provide analog precompensation adjustments to control and optimize the pixel color sensitivity balance and red:green-:blue gain-ratio of the integrated circuit amplifiers in optoelectronic array imaging devices. Adjustments in dye or pigment concentration loading are made, as in the previous thickness variable case, during the color filter fabrication process.

Common to all the objects of the present invention is high spectral efficiency through the elimination of the need for additional steps for layers of neutral-density attenuators.

Another object of the present invention is to teach a highly efficient and flexible microelectronic fabrication process for integrated color filter formation which is inherently compatible with integrated microlens array formation and the precision mutual alignments to each other and to the photodiode elements of the matrix array of a color video camera or other semiconductor array color imaging devices.

A still further object of the present invention is to provide a fabrication method for color filter and microlens array formation for high reproducibility (precision), reliability, maximum yield, minimum total run-time and production cost.

It is also recognized that the present invention and its manufacturing process based on real-time spectral measurements, algorithmic processing, and closed-loop feedback control during the color filter deposition and formation processes uniquely enable extremely high accuracy and precision to be achieved, in clear distinction to the open-loop color processes of Prior Art. It is an object of the present invention to employ the versatility and flexibility of real-time metrology-based feedback control loops to correct, adjust, compensate, or find related applicability to finely tune the optical-train of the semiconductor color imager for optimum spectral response, maximum image light collection efficiency, and superior image resolution, dynamic range, and spectral signal contrast.

Another object of the present invention is to obviate topographical step variations and non-planar problems encountered with conventional Prior Art formation sequences. Prior Art is well known to have step-height or steric effect variations between R/G/B layers and results in departures from designer's specifications in transmittance balance.

A further object of the present invention is to enable controlled adjustments during the coating sequence to obtain an increased range of specified R/G/B gain-ratio.

Avoidance of the specific color pixel lifting problem is a still further object of the present invention.

It is another principal object of the present invention to enable combinations and permutations of the color process variables, process sequence order, and, associated admixtures with the fabrication of microlens arrays, planarizing layers, spacer layers, and extensions to alternative classes or compositions of color filters beyond the dye or pigment absorption type used to illustrate the present invention.

In the present invention, the precedence flow-chart of the fabrication sequence creates the color filter array in the order B/R/G or B/G/R instead of the conventional G/R/B. It is an object of the present invention to enable dye or pigment concentration loading as an adjunct to the primary object of thickness adjustment control.

To practice the method of the present invention, conventional microelectronic fabrication techniques using photolithographic materials, masks and etch tools are employed: in succession the array of pn-junction photodiodes is patterned with impurity dopants diffused or ion-implanted, electrically isolated, and planarized over. A first pattern of precursor microlens structures, comprised of single or multiple coplanar lens elements, is formed, etched, and thermally reflowed.

The microlens array is subsequently planarized by a successive deposition step, and, if desired, a second pattern of precursor microlens structures, again comprised of single or multiple coplanar lens elements, is exposed, developed, and anisotropically etched to form a vertical aligned compound lens with the microlens elements of the first plane-array. As many planarizations and microlens array planes as desired may successively be formed by repetition of the previously described fabrication sequence. Following the completion of the microlens plane-array formation above the photodetector array, typically three more layers are built up additively with primary green, red, blue color filters formed by the addition of suitable dyes or pigments appropriate to the desired spectral transmissivity to be associated with specified photodetector coordinate addresses in the imager matrix. In the present invention the fabrication sequence orders the color filter formation as blue, red, green in accord with the specified several objects of the present invention.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

Figure 5:
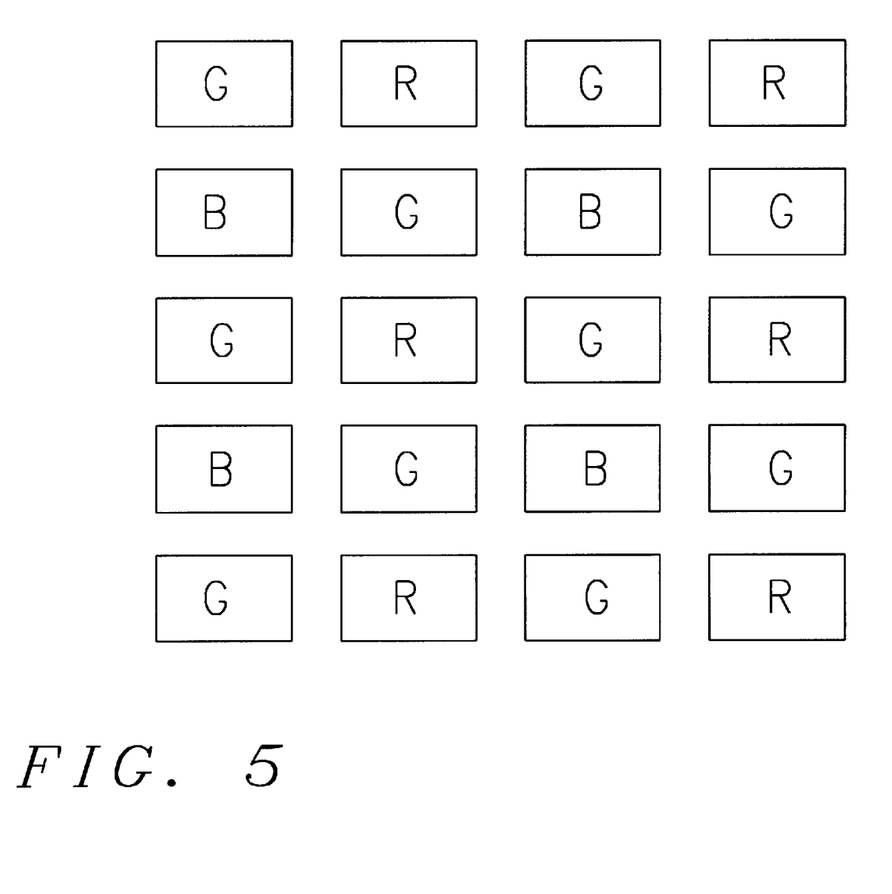
FIG. 5 is a representation of the color pixel structure of the present invention.

The present invention discloses that there exists superior fabrication sequencing in which the order of forming the color filter layers is the coating arrangement blue followed by green followed by red, or blue followed by red followed by green. In this method, the coating deposition is adjusted by means of a spectrophotometric feedback control loop to reach the actual thickness target for specified B/G/R gain-ratio. FIG. 5 shows the color pixel structure is the juxtaposition of two pairs of pixels comprised of one pair of (green, blue) contiguous with one pair of (green, red). In a plane projection, an inverted L-configuration with green at the vertex, blue below green, and, red to the right of green would be representative. Deposition of the blue coating first produces higher transmittance (e.g., 80% or higher) than the conventional G/R/B sequence. The blue thickness can be smaller than when starting with the conventional green layer, widening the process window, and, adhesion of the blue pixel to the substrate is stronger and can avoid the pixel lift-off problem. Thus, for example if the usual green material supplied normally has transmittance of 75% to 85%, and, the color balance specification requires 60% for the green layer, the thickness of the green pixel would need to be increased from about one micron to about 3 microns. By changing the color process coating sequence to blue first, adjustment of the blue layer thickness in conjunction with the green layer thickness reduces the required green layer thickness to achieve the desired combined transmittance specification for the color gain-ratio balance of the IC amplifiers.

To obtain a desired spectral transmittance curve it is necessary to combine the primary color filters of different absorption characteristics into a cascaded or series configuration. Unfortunately, because of the many different inter-reflections that may take place between the various surfaces, precise formulas for the resulting transmittance are very complicated. When the surface reflections are small, to a first approximation the resultant transmittance is given by $T\lambda = (T1)(T2)(T3)$, where the integers 1,2,3 represent the three color filter layers through which the image light is passed, and, $T\lambda$ is defined as the specular spectral transmittance of a filter at a wavelength $\lambda$. $T\lambda$ is equal to the ratio of the radiant energy of that wavelength transmitted Iout,$\lambda$ by the filter to that incident Iin,$\lambda$ upon it: $T\lambda = Iout,\lambda/Iin,\lambda$. When light passes through an absorbing material, such as a dye or pigment loaded color filter, its intensity is reduced.

Figure 7:
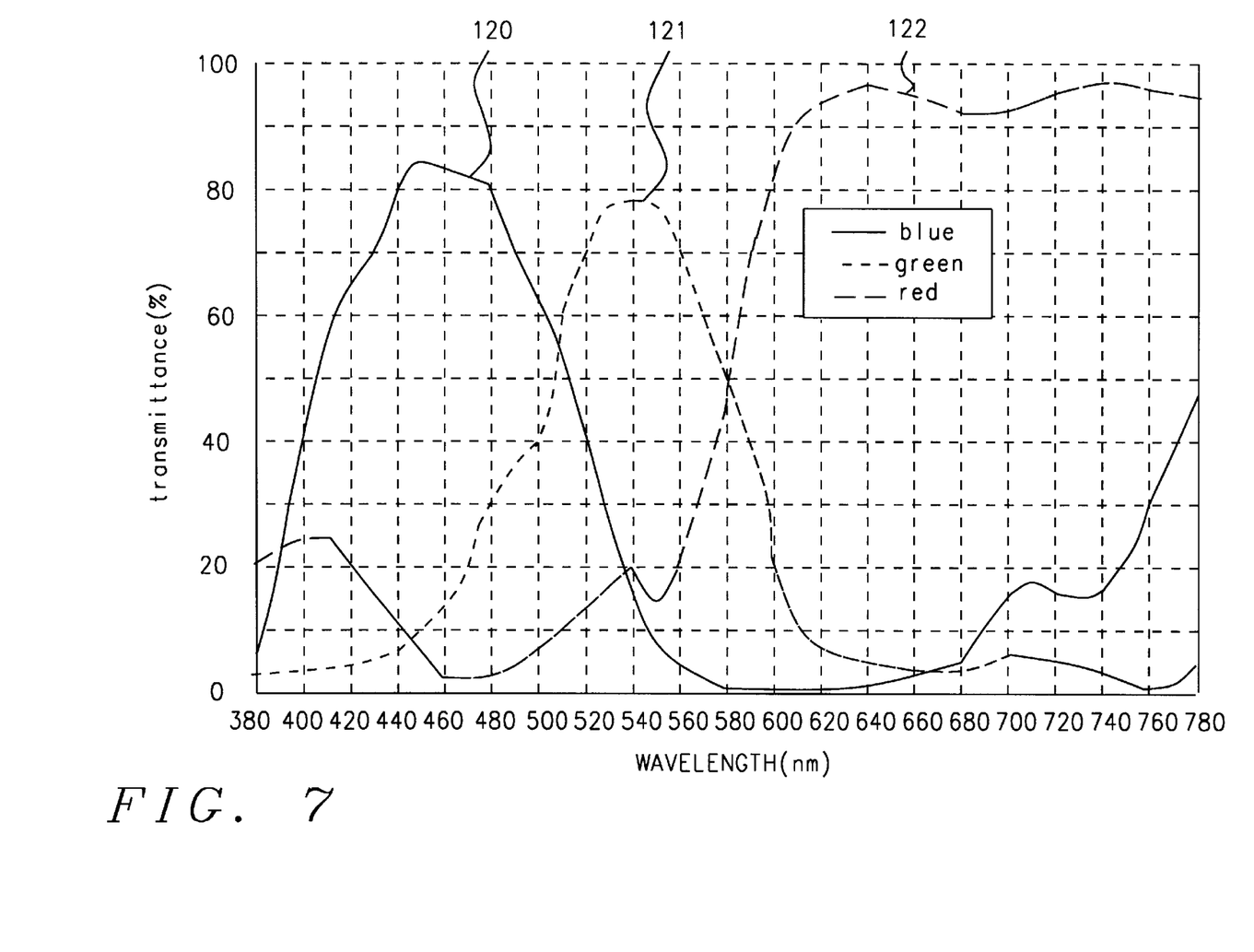
FIG. 7 shows the spectrophotometric graph of the successive subtractive effects on the spectral intensity passed by the sequence of color filters expressed as transmittance vs. wavelength.
Figure 8:
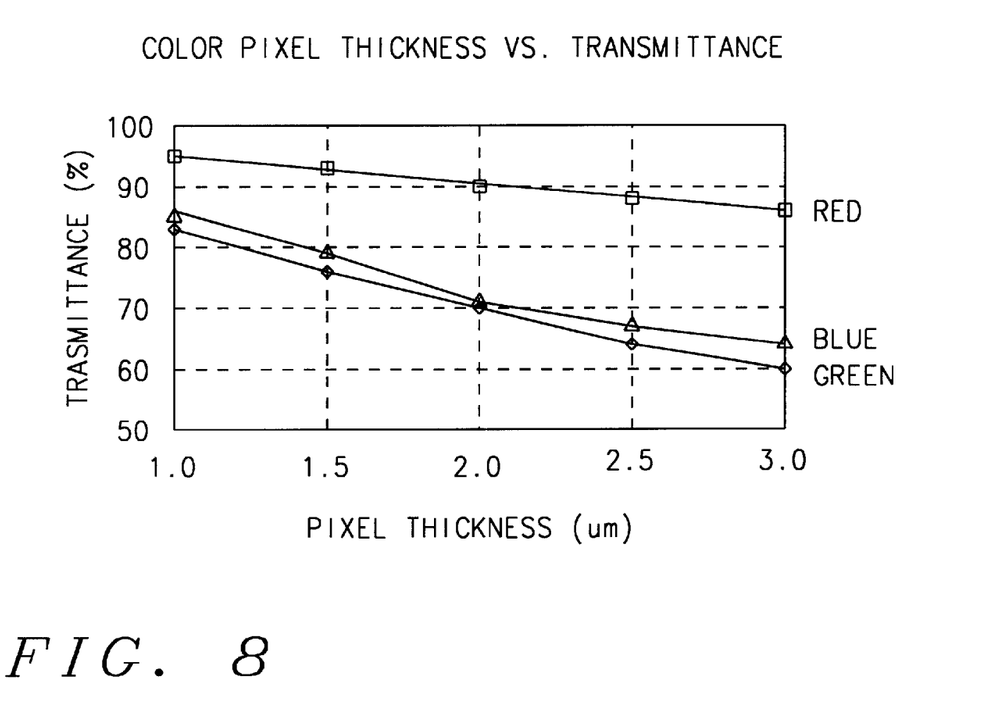
FIG. 8 discloses the method of how to adjust the color balance during the color filter process, expressed graphically as transmittance vs. thickness at the I-line wavelength for exposure of each of the blue, green, red dye-colored photoresist coatings.

The Beer-Lambert or Bouguer Law describes the intensity attenuation behavior for a dye or pigment color filter layer of thickness x, dye concentration c, and, molar spectral absorption coefficient $\alpha$, with incident light intensity Iin to the first surface and transmitted intensity Iout at the exit surface, at a wavelength $\lambda$: $Iout=Iin[exp(-\alpha cx)]$. Rearranging this law by dividing Iout by Iin, gives the exponential factor $exp(-\alpha cx)$. Substituting this exponential factor into $T\lambda=Iout/Iin$, and repeating this substitution for each of the three wavelength filters, one obtains an expression of the form: $I(x3)=Iin[exp(-\alpha 1\ c1\ x1)][exp(-\alpha 2\ c2\ x2)][exp(-\alpha 3\ c3\ x3)]$, where each absorption coefficient $\alpha$ is associated with the dye or pigment for filter layer 1,2,3 of concentration c1,c2,c3 and has layer thickness x1,x2,x3. From this analysis it is seen that the present invention teaches the value of the pixel layer thickness x1, x2 or x3 is adjusted during the color process to achieve the adjustment in the color sensitivity balance of the semiconductor array imaging device. By introducing the spectrophotometric technique, the thickness of each pixel vs. transmittance is measured and applied to determine the actual thickness to deposit when the specified value of transmittance has been reached. This method is illustrated in FIG. 7 and FIG. 8. It is also pointed out that this method is the most practical, since dye or pigment lot variations may change the value of the dye or pigment concentrations c1,c2,c3 and the absorption coefficients may not always be known exactly. The present invention has, therefore, no dependence on assumptions of concentration or absorbance, but relies on closed-loop feedback control and algorithmic guidance to adjust color filter values by layer thickness in real-time during the actual coating deposition process. This results in optimum pixel precision.

Figure 4:
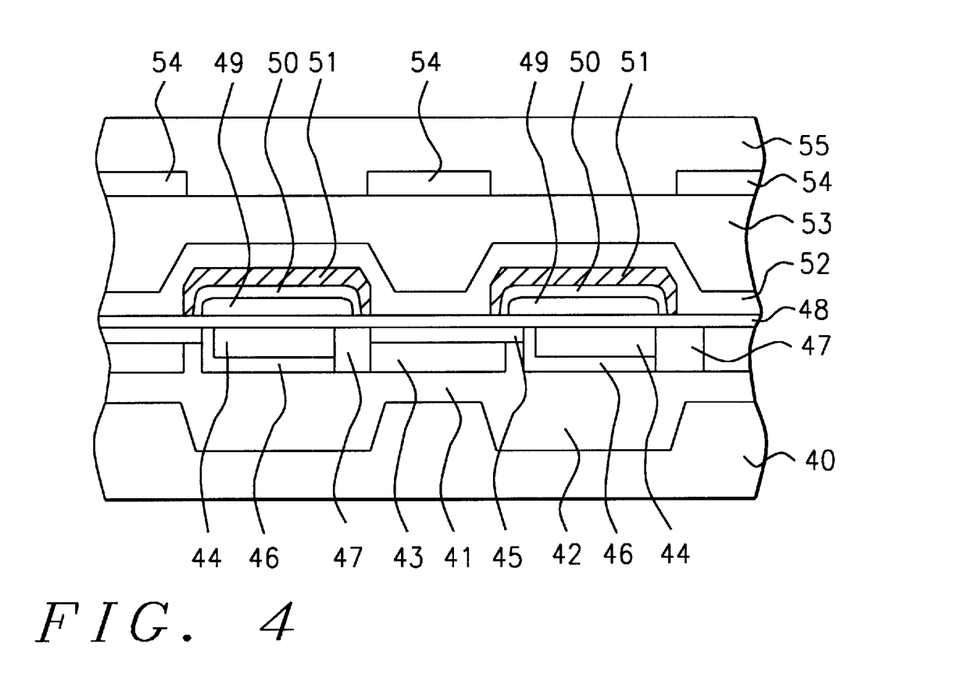
FIG. 4 shows detailed photodetector cross-sectional profile and mutual alignments with integrated color filter structures.

The case of a CCD imager fabrication sequence is illustrated here , but it is clearly recognized that the present invention equally well applies to charge-injection device (CID) imagers and CMOS imagers. In FIG. 4, an "n" (negative) type semiconductor substrate 40, is photolithographically patterned by suitable photoresist coating, masking, exposing and developing, to open regions for ion-implant or diffusion doping by selected impurity atoms to form p-(weakly doped positive) type wells 41 and 42. With similar photolithography steps, ion-implants or diffisions, an n+ type region 43 is formed to create a pn-junction photodiode and a vertical charge coupled device 44. A highly doped positive impurity, p++, is introduced selectively to form a surface isolation layer 45, and, a p-type well 47 is formed to isolate the CCD device 44. To isolate pixels, a p+ channel stop 47 is formed. The gate insulator 48 is then applied over the surface of the substrate. The vertical profile is completed by processing successive additions of transmission gate 49, interlevel insulator 50, light-shielding layer 51, passivation layer 52, planarization layer 53, and in accord with the sequence of the present invention, first blue color filter layer 54, and transparent planarization, spacer, and encapsulant layer 55. Two further repetitions of this process are performed to cascade and overlay additional filter layers to provide green over blue and red over green filter combinations to create the final color pixel configuration.

When FIG. 4 is viewed perpendicular to the plane of the page, one observes a pair of blue and green contiguous filters. Rotating the view by 90 degrees, the next view is in the plane of the page, wherein the pair of contiguous filters are now green and red. The color pixel is then comprised of the two pairs of blue and green filters contiguous with the same green and the adjacent red filter, forming an inverted L with the green filter at the vertex of the L. FIG. 5 depicts the color pixel structure described.

Figure 6:
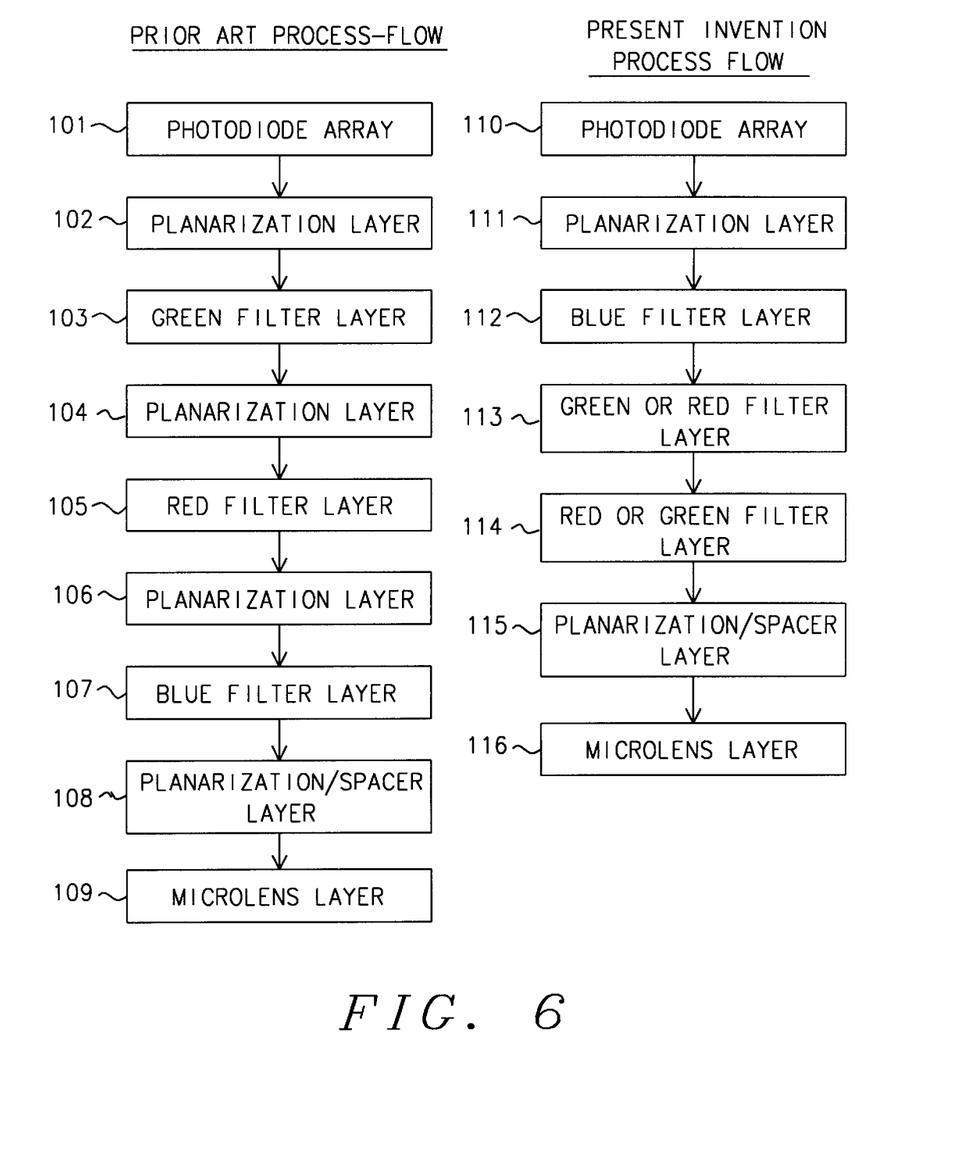
FIG. 6 specifies the process flow-chart of the preferred order(s) for the fabrication sequence of color filter formation of the present invention.

FIG. 6 compares the process flow-chart of the preferred order(s) for the fabrication sequence(s) for spectral (color) filter formation of the present invention with that of Prior Art. Intercomparison reveals that the present invention process-flow chart reduces the number of fabrication steps by about one-third of the Prior Art number of steps. Because of the closed feedback control-loop during the dyed or pigmented photoresist deposition process, layer thickness and surface flatness are guided to precise stops. More importantly, the spectral transmittance of each layer is determined to meet the color gain-ratio balance specification for the IC amplifiers, and, can be tailored to the IC amplifier process variance to maintain statistical process control for the entire color process. Yields are maximized, production costs minimized, and, superior video camera products are enabled by the control-loops of the fabrication process of the present invention. FIG. 6 illustrates the Prior Art process in the nine steps 101 through 109 in contrast to the six steps 110 through 116 of the present invention.

FIG. 7 shows the successive substractive effects on the spectral intensity of light passed through the cascade of color filters, expressed as per cent transmittance vs. wavelength. The Blue spectral-curve 120, measured by scanning through wavelengths from 380 nm to 780 nm, exhibits high transmissivity (>80%) of the blue dyed photoresist in the wavelength interval for typical photolithographic exposure. The Green spectral-curve 121 and Red spectral-curve 122 are seen to overlap the Blue curve 120 and each other. Spectroscopists refer to these overlaps as superposition, and, the practical result is that when Blue is first to pass the image light in a video camera or related device, the light is modified by the Blue filter function (curve), convolved into the next filter function (curve), such as green, and so on into the Red filter function. At each wavelength, the three filter functions obey the Law of Superposition, and, the light finally exiting the last surface of the last filter will impinge upon the photodetector array elements to create the color pixel spectral response. The photodetector spectral sensitivity and detectivity, coupled with spectral noise, is passed to the integrated circuit amplifiers and there signal processed via algorithms into color synthetic reconstruction of the original color image. Consequently, the color sensitivity balance can be adjusted either by the gains of the amplifiers or the transmittance characteristic curves of the train of cascaded color filters. The present invention asserts that it is more practical, less costly, and, more manufacturable to modify the filter characteristics through the coating deposition process than by any other method or means.

FIG. 8 shows how to adjust this very important color sensitivity balance during the color filter fabrication process. Spectrophotometric monitoring during the deposition enables precise thickness control through the calibration of Transmittance (%) vs. Pixel Thickness (microns=um). Calibration of the photodiode spectral response and integrated circuit amplifier gain of the CCD, CID, or CMOS imager, sets the thickness specification exactly. To account for possible statistical process variation in either the photodiode or amplifier gain, signal output can be measured in real-time against the spectrophotometric monitor to adjust completely to meet exact gain-ratio balance specifications.

While the invention has been particularly shown and described with reference to the preferred embodiments thereof, it will be understood by those skilled in the art that various changes in form and details may be made without departing from the spirit and scope of the invention.

What is claimed is:

1. A real-time adaptive, ordered microelectronic fabrication process for adjusting color sensitivity balance during formation of integrated primary color filters in semiconductor array imagers, comprising the steps of:

providing a semiconductor substrate having a matrix of photodiode elements formed thereon;

depositing a passivation coating encapsulating a metal photoshield layer, wherein the metal photoshield elements are periodically spaced to cover the areas between the photodiode elements;

forming upon the patterned and encapsulated metal photoshield layer a first optically transparent planarizing encapsulant layer;

forming upon the first optically transparent planarizing encapsulant layer a first patterned lowermost blue filter layer registered with the photodiode elements, and deposited to a thickness value adjusted by a real-time spectrophotometric algorithmic analyzer driving a feedback servo-control loop, operating during the deposition process step to provide analog filter precompensation to achieve a color balance gain-ratio set by the integrated circuit amplifiers of the imaging device;

forming over the first patterned lowermost blue filter layer a second patterned red filter layer registered with the first patterned lowermost blue filter layer and the photodiode array elements, and, formed using the identical servo-control process described herein for the lowermost blue filter;

forming over the second patterned red filter layer a third green filter layer registered to the red filter and the lowermost blue filter layers and the photodiode array elements, and, formed using the identical servo-control process described herein for the blue and red filters; and forming upon the patterned green filter layer a spacer layer registered to all filter layers and a first microlens layer in mutual registration with all the preceding optical filter layers and the photodiode array elements.

2. The method of claim 1, further comprising the steps of forming a second optically transparent planarizing encapsulant layer on the first patterned blue filter layer, forming a third optically transparent planarizing encapsulant layer on the patterned red filter layer, and, forming a fourth optically transparent planarizing encapsulant layer on the patterned green filter layer.

3. The method of manufacturing a solid-state imaging device as claimed in claim 1, wherein the preferred ordered sequence of coating depositions for the filter process is blue followed by green followed by red.

4. The method of claim 1 wherein the color filters are comprised of any of the following types selected from the group consisting of: dichroic filters, photochromics, multilayer dielectric or color-interference filters, fluorescent dye filters, birefringent dyed layers, pigmented, or polarizing spectral filters.

5. The method of manufacturing a solid-state imaging device as claimed in claim 1, wherein dye or pigment loading concentration of the photoresist is varied in combination with or in place of color filter thickness.

6. The method of claim 1, wherein the color filter layer(s) or spacer layer(s) comprise an antireflection coating contiguous with the surface(s) of the microlens array to minimize interfacial reflection loss.

7. The method of manufacturing a solid-state imaging device as claimed in claim 1, wherein the semiconductor substrate may be selected from the group consisting of periodic table IV, III–V, II–VI, or other simple or compound semiconductors.

8. The method of claim 1, wherein said photodiode color imaging device may be selected from the group consisting of charge-coupled (CCD), charge injection (CID), or CMOS semiconductors.

9. The structure of claim 1 wherein the color filter is comprised of a plane-matrix array comprised of patterned stripes of the same or different colors, ordered clusters of colors or groupings, multiplanar clusters or groupings, or combinations and permutations thereof.

10. The structure of claim 1, wherein the color filter layer has the property of rotary polarization such that light passed through such layers will, upon incidence to a lower boundary-layer interface, be inhibited from retrotransmission and eliminate stray light reflections and image smear.

11. The method of claim 1, wherein the relative thickness of each color filter layer is regulated to obtain the desired gain-balance without changes to any circuit layout.

12. The method of claim 1, wherein the transmittance of each color filter is designed to both achieve color-balance and be maximized by the algorithms driving the coatings servo-controller to provide maximum image light collection efficiency to the photodiode array elements for optimum spectral signal contrast, dynamic range, and superior image resolution.

13. The method of claim 1, wherein controlled adjustments during the coating sequence will increase the range of specified R/G/B gain-ratio.

14. The method of claim 1, wherein color pixel structures can be formed to accommodate non-regular or L-shaped sensor configurations, including the pairing of coplanar arrangements of different color filters.

15. The method of claim 1, wherein elimination of the steric effect, color filter planarization, or the intentional creation of non-planar surface topographies for the spectral filter layers are enabled.

16. The method of manufacturing a solid-state imaging device as claimed in claim 1, wherein the microlens array is subsequently planarized by a successive deposition step, and, if desired, a second pattern of microlens structures is exposed, developed, etched, reflowed, and, formed into a vertically aligned compound lens;

formed thereon, color filter layers are deposited under spectrophotometric servo-control, including the case of deposition between the microlens layers, in registration with the photodiode array elements of the imager, to provide pixel configurations for said compound microlens structures.

* * * * *